United States Patent
Kim et al.

(10) Patent No.: US 10,547,028 B2
(45) Date of Patent: *Jan. 28, 2020

(54) ORGANIC LIGHT EMITTING DIODE DEVICE WITH BARRIER WALL

(71) Applicant: SAMSUNG DISPLAY CO., LTD., Yongin-si, Gyeonggi-do (KR)

(72) Inventors: Mikyung Kim, Asan-si (KR); Sunyoul Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 2 days.

This patent is subject to a terminal disclaimer.

(21) Appl. No.: 14/855,337

(22) Filed: Sep. 15, 2015

(65) Prior Publication Data

US 2016/0268547 A1    Sep. 15, 2016

(30) Foreign Application Priority Data

Mar. 9, 2015 (KR) .................. 10-2015-0032501

(51) Int. Cl.
*H01L 51/52* (2006.01)
*H01L 51/56* (2006.01)
*H01L 27/32* (2006.01)

(52) U.S. Cl.
CPC ...... *H01L 51/5256* (2013.01); *H01L 27/3246* (2013.01); *H01L 51/56* (2013.01)

(58) Field of Classification Search
CPC ............ H01L 51/5246; H01L 51/5256; H01L 51/524
See application file for complete search history.

(56) References Cited

U.S. PATENT DOCUMENTS

| 8,659,224 B1 | 2/2014 | Moon |
| 9,035,291 B2 * | 5/2015 | Kim ............... H01L 51/56 |
| | | 257/40 |

(Continued)

FOREIGN PATENT DOCUMENTS

| KR | 10-2005-0117049 A | 12/2005 |
| KR | 10-2012-0045889 | 5/2012 |

(Continued)

OTHER PUBLICATIONS

U.S. Office Action dated Sep. 8, 2014, issued in cross-reference U.S. Appl. No. 14/010,296 (11 pages).

(Continued)

*Primary Examiner* — Thao X Le
*Assistant Examiner* — Laura M Dykes
(74) *Attorney, Agent, or Firm* — Lewis Roca Rothgerber Christie LLP (57) ABSTRACT

A method of manufacturing an organic light emitting diode (OLED) display device includes: providing a substrate including a display area and a non-display area; forming an organic light emitting diode element in the display area; forming a barrier wall around the display area and spaced apart from the organic light emitting diode element; performing a plasma treatment on the substrate on which the organic light emitting diode element is formed; and forming a thin film encapsulation layer for coating the organic light emitting diode element, wherein forming the thin film encapsulation layer includes: forming at least one inorganic layer; and forming at least one organic layer inwardly of the barrier wall.

13 Claims, 9 Drawing Sheets

(56) References Cited

U.S. PATENT DOCUMENTS

| | | | |
|---|---|---|---|
| 9,419,247 B2 * | 8/2016 | Kim | H01L 51/5256 |
| 2003/0164674 A1 | 9/2003 | Imamura | |
| 2004/0164676 A1 * | 8/2004 | Omura | H01L 51/5259 |
| | | | 313/512 |
| 2005/0277355 A1 | 12/2005 | Choi et al. | |
| 2006/0012300 A1 | 1/2006 | Lan et al. | |
| 2007/0018566 A1 * | 1/2007 | Yamazaki | H01L 51/56 |
| | | | 313/498 |
| 2007/0102737 A1 | 5/2007 | Kashiwabara et al. | |
| 2007/0159089 A1 | 7/2007 | Oh et al. | |
| 2007/0159096 A1 | 7/2007 | Oh et al. | |
| 2008/0157656 A1 | 7/2008 | Liao et al. | |
| 2009/0179566 A1 * | 7/2009 | Imamura | H05B 33/04 |
| | | | 313/512 |
| 2010/0009531 A1 | 1/2010 | Choi et al. | |
| 2010/0026167 A1 | 2/2010 | Park et al. | |
| 2011/0291116 A1 * | 12/2011 | Kang | H01L 51/56 |
| | | | 257/88 |
| 2012/0091477 A1 * | 4/2012 | Kim | H01L 51/5246 |
| | | | 257/88 |
| 2012/0133275 A1 | 5/2012 | Lee et al. | |
| 2012/0319141 A1 | 12/2012 | Kim | |
| 2013/0037792 A1 | 2/2013 | Kim et al. | |
| 2013/0127335 A1 | 5/2013 | Chang et al. | |
| 2013/0187163 A1 | 7/2013 | Kim et al. | |
| 2013/0328480 A1 | 12/2013 | Joo et al. | |
| 2014/0117336 A1 * | 5/2014 | Kim | H01L 51/5246 |
| | | | 257/40 |
| 2014/0118947 A1 * | 5/2014 | Chen | H05K 7/20963 |
| | | | 361/707 |
| 2014/0131683 A1 * | 5/2014 | Kim | H01L 51/5253 |
| | | | 257/40 |
| 2014/0179041 A1 | 6/2014 | Huh et al. | |
| 2014/0217371 A1 | 8/2014 | Kim et al. | |

FOREIGN PATENT DOCUMENTS

| | | |
|---|---|---|
| KR | 10-2012-0057286 A | 6/2012 |
| KR | 10-2013-0138615 A | 12/2013 |
| KR | 10-2014-0082479 A | 7/2014 |
| KR | 10-2014-0100733 A | 8/2014 |

OTHER PUBLICATIONS

U.S. Office Action dated Nov. 25, 2015, issued in cross-reference U.S. Appl. No. 14/691,416 (11 pages).

* cited by examiner

ORGANIC LIGHT EMITTING DIODE DEVICE WITH BARRIER WALL

CROSS-REFERENCE TO RELATED APPLICATION

This application claims priority to and the benefit of Korean Patent Application No. 10-2015-0032501, filed on Mar. 9, 2015, with the Korean Intellectual Property Office, the entire content of which is incorporated herein in its entirety by reference.

BACKGROUND

1. Field

Aspects of embodiments of the present invention relate to an organic light emitting diode (OLED) display device and a method of manufacturing the same, and more particularly, to an OLED display device enhanced in regard to the adhesiveness between a substrate and an encapsulation structure, and a method of manufacturing the same.

2. Description of the Related Art

In organic light emitting diode (OLED) display devices, OLED elements are often deteriorated by the infiltration of oxygen or moisture thereinto. Accordingly, to reduce or effectively prevent the infiltration of oxygen or moisture, an encapsulation structure for encapsulating and protecting an OLED element from an external environment is needed.

Conventionally, as such an encapsulation structure, a thin film encapsulation structure having a multilayer structure, in which an organic layer and an inorganic layer are alternately stacked to cover an OLED element, has been widely used. In other words, an organic layer and an inorganic layer are alternately stacked on an OLED element of a substrate so as to encapsulate the OLED element.

The organic layer serves to provide the flexibility of a flat panel display (FPD) device while the inorganic layer serves to reduce or effectively prevent the infiltration of oxygen or moisture thereinto. Accordingly, to reduce or effectively prevent the external infiltration of oxygen or moisture, an organic layer is positioned at an inner portion of the display device to be adjacent an OLED element, and an inorganic layer is positioned at an outer portion of the display device.

Meanwhile, prior to forming such an encapsulation structure, there may be a case in which a few residual organic layers are unnecessarily or inadvertently deposited while forming an OLED element, for example, at an outer portion of the OLED element. Because the deposited portion of the OLED element is an area only requiring an inorganic layer, when an organic layer is present in such an area, the adhesiveness between a substrate and an encapsulation structure may decrease, such that a peeling-off issue is caused, and such that the external infiltration of moisture or oxygen occurs, thereby resulting in a dark spot defect.

It is to be understood that this background of the technology section is intended to provide useful background for understanding the technology and as such, the technology background section may include ideas, concepts, or observations that were not part of what was known or appreciated by those skilled in the pertinent art prior to a corresponding effective filing date of subject matter disclosed herein.

SUMMARY

One or more embodiments of the present invention are directed to an organic light emitting diode (OLED) display device capable of removing a residual organic layer, which remains on a substrate by performing a cleaning process prior to forming an encapsulation structure.

In addition, the adhesiveness between a substrate and an encapsulation structure may be enhanced, and the external infiltration of moisture or oxygen thereinto may be reduced or effectively prevented, by removing such a residual organic layer through use of the organic light emitting diode display device and a method of manufacturing the same.

According to an embodiment of the present invention, a method of manufacturing an organic light emitting diode display device includes providing a substrate including a display area and a non-display area; forming an organic light emitting diode element in the display area; forming a barrier wall around the display area and spaced apart from the organic light emitting diode element; performing a plasma treatment on the substrate on which the organic light emitting diode element is formed; and forming a thin film encapsulation layer for coating the organic light emitting diode element, wherein the forming of the thin film encapsulation layer includes: forming at least one inorganic layer; and forming at least one organic layer inwardly of the barrier wall The forming of the organic light emitting diode element may include: forming an insulating layer on the substrate; forming a pattern of a first electrode on the insulating layer; forming a pixel defining layer by which the patterned first electrode is divided into a pixel unit; forming a light emitting layer on the first electrode; and forming a second electrode on the light emitting layer, wherein the barrier wall and the pixel defining layer are formed in the same process.

The plasma treatment may be performed under in an inert gas atmosphere.

The at least one inorganic layer and the at least one organic layer may include a total of 2 to 20 layers.

The barrier wall may have a height less than or equal to a height of an uppermost inorganic layer of the thin film encapsulation layer.

Forming the barrier wall may include forming two or more barrier walls.

A height difference may be present between the two or more barrier walls.

The barrier wall may be at least one of an organic material and an inorganic material.

The barrier wall comprises the organic material which may include at least one of a photoresist, a polyacrylic resin, a polyimide resin, and an acrylic resin.

The barrier wall comprises the inorganic material which may include a silicon compound.

According to another embodiment of the present invention, an organic light emitting diode display device includes: a substrate including a display area and a non-display area; an organic light emitting diode element located at the display area; a thin film encapsulation layer coating the organic light emitting diode element; and a barrier wall around the display area and spaced apart from the organic light emitting diode element, wherein the thin film encapsulation layer is a multilayer in which at least one inorganic layer and at least one organic layer are alternately stacked, and wherein the at least one organic layer of the thin film encapsulation layer is located inward of the barrier wall.

The organic light emitting diode element may include a first electrode, a light emitting layer, and a second electrode which are sequentially stacked.

An outer side of the barrier wall may directly contact the inorganic layer.

The at least one inorganic layer and the at least one organic layer may include 2 to 20 alternately stacked layers.

The barrier wall may have a height that is the same as a height of an uppermost inorganic layer of the thin film encapsulation layer.

The barrier wall may include two or more barrier walls.

A height difference may be present between the two or more barrier walls.

The barrier wall may include at least one of an organic material and an inorganic material.

The organic material may include at least one of a photoresist, a polyacrylic resin, a polyimide resin, and an acrylic resin.

The inorganic material may include a silicon compound.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure will be more clearly understood from the following detailed description taken in conjunction with the accompanying drawings, in which.

DETAILED DESCRIPTION

Hereinafter, exemplary embodiments of the present invention will now be described in more detail with reference to the accompanying drawings.

The invention, however, may be embodied in many different forms, and should not be construed as being limited to the exemplary embodiments set forth herein. Rather, these exemplary embodiments are provided so that this disclosure will be thorough and complete, and will fully convey the scope of present the invention to those skilled in the art.

Also, terms used herein refer to general terms that are currently in wide use. However, if certain terms are randomly selected by the applicant, such terms should be described in the detailed description, or should be identified based on the intent of the usage thereof.

When it is determined that a detailed description of a technique known in the art may make the purpose of the present invention unnecessarily ambiguous in the present description, the particular detailed description will be omitted. In addition, the same components and corresponding components are given the same reference numeral. Further, the areas illustrated in the drawings are schematic in nature, and their shapes are neither intended to illustrate the actual shape of an area of a device nor intended to limit the scope of exemplary embodiments.

In the drawings, thicknesses of a plurality of layers and areas may be illustrated in an enlarged manner for clarity and for ease of description thereof. When a layer, area, or plate is referred to as being "on" another layer, area, or plate, it may be directly on the other layer, area, or plate, or one or more intervening layers, areas, or plates may be present therebetween.

Expressions such as "at least one of," when preceding a list of elements, modify the entire list of elements and do not modify the individual elements of the list. Further, the use of "may" when describing embodiments of the present invention refers to "one or more embodiments of the present invention." It will be understood that when an element or layer is referred to as being "on," "connected to," "coupled to," or "adjacent" another element or layer, it can be directly on, connected to, coupled to, or adjacent the other element or layer, or one or more intervening elements or layers may be present. When an element or layer is referred to as being "directly on," "directly connected to," "directly coupled to," or "immediately adjacent" another element or layer, there are no intervening elements or layers present.

Spatially relative terms, such as "beneath," "below," "lower," "downward," "above," "upper," and the like, may be used herein for ease of description to describe one element's or feature's relationship to another element(s) or feature(s) as illustrated in the figures. It will be understood that the spatially relative terms are intended to encompass different orientations of the device in use or in operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein should be interpreted accordingly. In addition, it will also be understood that when a layer is referred to as being "between" two layers, it may be the only layer between the two layers, or one or more intervening layers may also be present.

It will be understood that, although the terms "first," "second," "third," etc., may be used herein to describe various elements, components, regions, layers, and/or sections, these elements, components, regions, layers and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section, without departing from the spirit and scope of the present inventive concept.

The terminology used herein is for the purpose of describing particular embodiments only, and is not intended to be limiting of the inventive concept. As used herein, the singular forms "a" and "an" are intended to include the plural forms as well, unless the context clearly indicates otherwise. As used herein, the term "and/or" includes any and all combinations of one or more of the associated listed items. Also, the term "exemplary" is intended to refer to an example or illustration.

Figure 1:
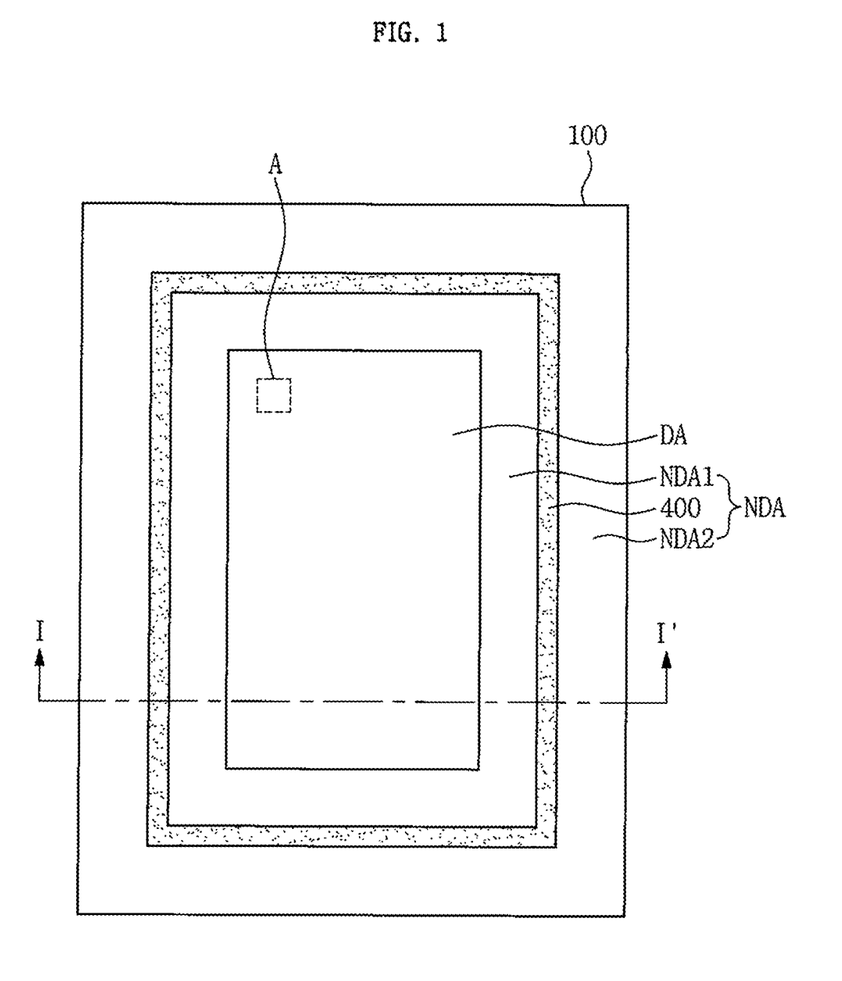
FIG. 1 is a plan view schematically illustrating an organic light emitting diode (OLED) display device according to an exemplary embodiment.

FIG. 1 is a plan view schematically illustrating an OLED display device according to an exemplary embodiment.

Referring to FIG. 1, a substrate 100 of the OLED display device may include a display area DA and a non-display area NDA formed around the display area DA. The display area DA may be defined as an area at which an OLED element is located. The configuration of the OLED display device illustrated in FIG. 1 will further be described with reference to FIG. 2.

The non-display area NDA may include a first non-display area NDA1 formed around the display area DA, a barrier wall 400, and a second non-display area NDA2 formed outwardly of the barrier wall 400. In detail, the first non-display area NDA1 may be defined as an area between the display area DA and the barrier wall 400, and the second non-display area NDA2 may be defined as an area surrounding the barrier wall 400.

Figure 2:
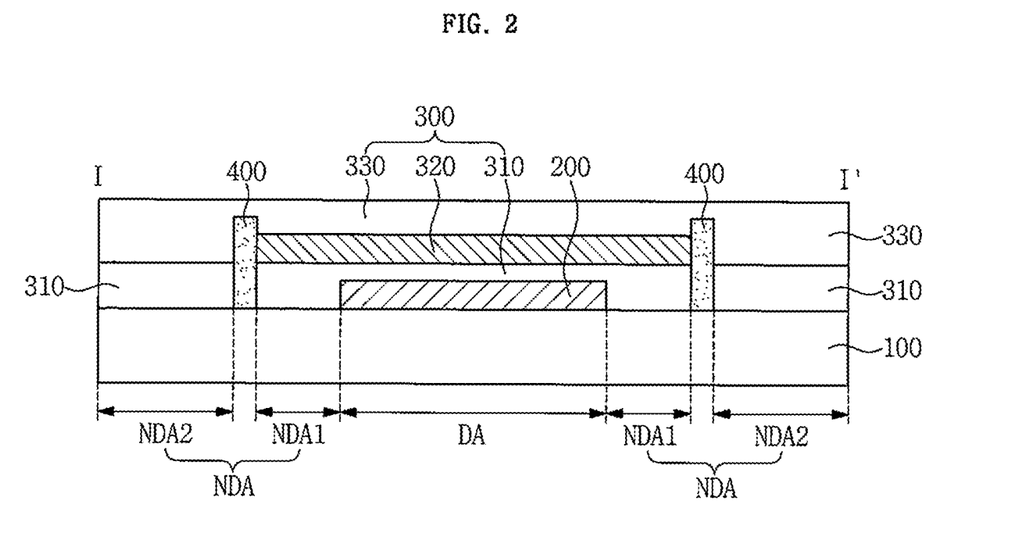
FIG. 2 is a cross-sectional view taken along the line I-I' of FIG. 1.

FIG. 2 is a cross-sectional view taken along the line I-I' of FIG. 1.

Referring to FIG. 2, the OLED display device may include the substrate 100 including the display area DA and the non-display area NDA; the OLED element 200 located in the display area DA; a thin film encapsulation layer 300 coating the OLED element 200; and the barrier wall 400 located around the display area DA to be spaced apart from the OLED element 200. The thin film encapsulation layer 300 may have a multilayer structure in which one or more inorganic layers 310 and 330 and at least one organic layer 320 are alternately stacked. The organic layer 320 of the thin film encapsulation layer 300 may be located inwardly of the barrier wall 400.

The substrate 100 may be any substrate that may be used in a conventional OLED display device, and may be a glass substrate or a transparent plastic substrate having excellent mechanical strength, thermal stability, transparency, surface smoothness, ease of handling, and water resistance. A planarization layer, an insulating layer, and the like, may further be provided on the substrate 100, and as such, various suitable modifications may be made to the substrate 100.

The OLED element 200 located in the display area DA of the substrate 100 may include a first electrode, a light emitting layer, and a second electrode that are sequentially stacked. A detailed description of the OLED element 200 will further be provided with reference to FIGS. 3 and 4.

The thin film encapsulation layer 300 coating the OLED element 200 may be provided, and may include the first inorganic layer 310, the first organic layer 320, and the second inorganic layer 330.

The thin film encapsulation layer 300 may have a multilayer structure in which one or more inorganic layers and one or more organic layers are alternately stacked for a total of 2 to 20 layers. However, the number of the organic and inorganic layers is not limited thereto.

Referring to FIG. 2, the barrier wall 400 may be located on the substrate 100 around the display area DA, which is defined by the OLED element 200, to be spaced apart from the OLED element 200.

The barrier wall 400 may be located in the non-display area NDA to be spaced apart from the OLED element 200. The organic layer 320 of the thin film encapsulation layer 300 may be located inwardly of the barrier wall 400, thus allowing a monomer for forming an organic layer to be only deposited in a desired position.

The barrier wall 400 may be formed simultaneously with a formation of a pixel defining layer. Accordingly, manufacturing an additional mask may be unnecessary, and a material for forming the barrier wall 400 may use any conventional material suitable for forming a pixel defining layer. In detail, such a material for forming the barrier wall 400 may include one or more of the following materials: an organic material such as a photoresist, a polyacrylic resin, a polyimide resin, and an acrylic resin, and an inorganic material, such as a silicon compound.

According to the exemplary embodiment, the barrier wall 400 may be formed without being particularly limited by the position, the shape, the size, or the number thereof.

The barrier wall 400 may be present in any position within the non-display area NDA. However, more particularly, the barrier wall 400 may be positioned in the vinicity of the display area DA to improve the non-display area NDA. In addition, the barrier wall 400 may have a straight-line shape or a dotted-line shape, and may also be formed to have various desired shapes, such as a quadrangular shape, a circular shape, or a triangular shape.

With regard to the size of the barrier wall 400, because a height of the barrier wall 400 is affected by a thickness of the thin film encapsulation layer 300, the height of the barrier wall 400 may be, more particularly, less than the thickness of the thin film encapsulation layer 300, and because a width of the barrier wall 400 is affected by a width of the non-display area NDA, the width of the barrier wall 400 may be, more particularly, less than the width of the non-display area NDA.

As an example, the height of the barrier wall 400 may be the same as, substantially the same as, lower than, or higher than a height of an uppermost organic layer constituting the thin film encapsulation layer 300 (e.g., organic layer 320). As another example, the height of the barrier wall 400 may be, more particularly, the same as, substantially the same as, or lower than a height of an uppermost inorganic layer constituting the thin film encapsulation layer 300 (e.g, inorganic layer 330).

Because the barrier wall 400 is obtained by performing a patterning on a mask for a pixel defining layer in a desired manner, the barrier wall 400 may be formed to have two sides or four sides thereof, or may be formed at a desired position.

FIG. 2 illustrates an example in which a single barrier wall 400 is located in the non-display area NDA, and as illustrated in FIG. 1, the barrier wall 400 is formed to have four sides provided in a single-wall structure.

Figure 3:
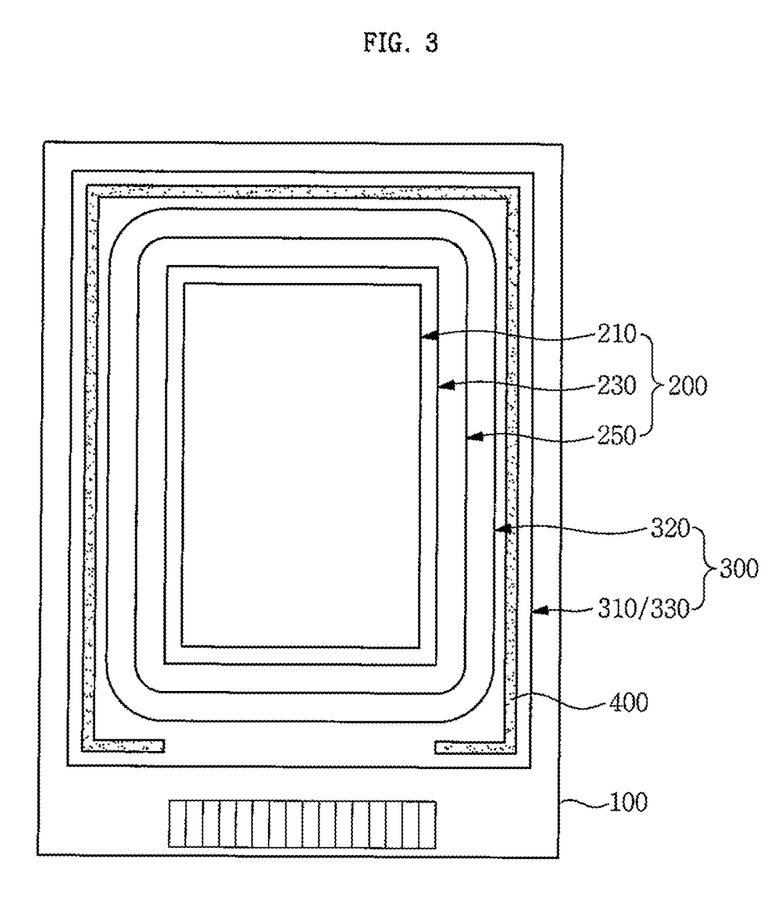
FIG. 3 is a plan view schematically illustrating an OLED display device according to another exemplary embodiment.
Figure 4:
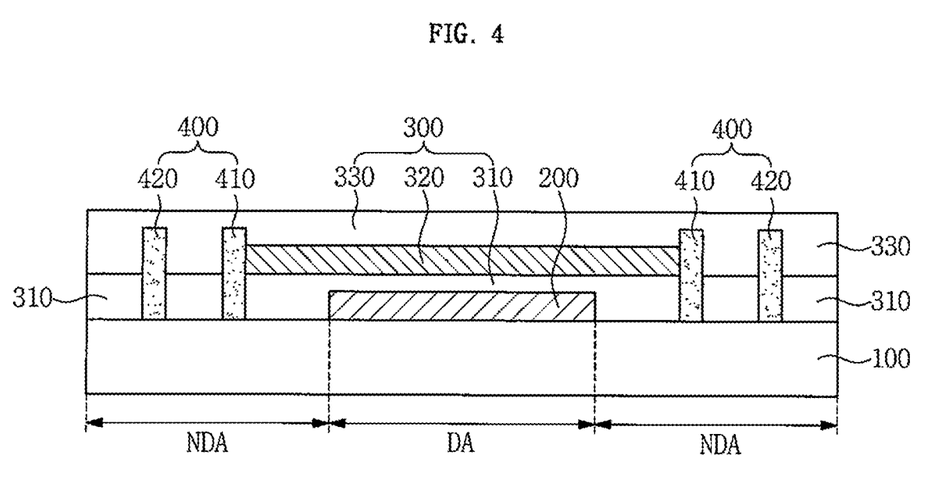
FIG. 4 is a cross-sectional view schematically illustrating an OLED display device according to the embodiment of FIG. 3.

FIGS. 3 and 4 are views schematically illustrating a structure of an OLED display device including two layers of the barrier wall 400 according to another exemplary embodiment.

Referring to FIG. 3, and unlike the embodiment described with respect to FIGS. 1 and 2, the barrier wall 400 may have a double-wall structure in which continuous upper, left, and right sides, that is, three continuous sides of the barrier wall 400, are formed absent a continuous lower side thereof. Although FIG. 3 illustrates the barrier wall 400 as a single-wall structure, it may be appreciated that the barrier wall 400 of FIG. 3 may include a first barrier wall 410 and a second barrier wall 420, which' are illustrated in FIG. 4.

As illustrated in FIG. 4, the barrier wall 400 may have a double-wall structure including the first barrier wall 410 and the second barrier wall 420. Although the present exemplary embodiment illustrates the double-wall structure including two layers 410 and 420 of the barrier wall 400, the number of layers of the barrier wall 400 is not particularly limited, and the number of layers of the barrier wall 400 may be provided in various manners, given that the barrier wall 400 does not exceed the width of the non-display area NDA.

Although FIG. 4 illustrates an example in which a height of the first barrier wall 410 is the same or substantially the same as a height of the second barrier wall 420, when two or more layers of the barrier wall 400 are used, a height difference may be present between two or more of the various layers.

The first barrier wall 410 and the second barrier wall 420 may be formed simultaneously with the formation of the OLED element 200, more particularly, with the formation of the pixel defining layer. Subsequently, the first inorganic layer 310 of the thin film encapsulation layer 300 may coat the OLED element 200, and in this instance, the first inorganic layer 310 may be deposited over the substrate 100, absent portions of the substrate 100 on which the first barrier wall 410 and the second barrier wall 420, provided in the double-wall structure, are formed. The first organic layer 320 may be formed inwardly of the first barrier wall 410 (e.g., one of the two layers of the barrier wall 400 having the double-wall structure), and the second inorganic layer 330, which coats the first organic layer 320 and the barrier wall 400 (e.g., the first barrier wall 410 and the second barrier wall 420), may be formed.

Referring to FIGS. 3 and 4, although the OLED display device according to the other exemplary embodiment illustrates the barrier wall 400, that is, the first barrier wall 410 and the second barrier wall 420 provided in the double-wall structure, as being located in a straight-line shape, the barrier wall 400 having the double-wall structure may have a dotted-line shape, as previously described, and may be formed to have various shapes, such as a circular shape, a triangular shape, or the like.

According to still another exemplary embodiment, an OLED display device including a thin film encapsulation layer having a plurality of inorganic and organic layers may be provided. A height of a barrier wall may be adjusted based on the number of the inorganic and organic layers.

The thin film encapsulation layer of the OLED display device according to such an exemplary embodiment may include a first inorganic layer, a first organic layer, a second inorganic layer, a second organic layer, and a third inorganic layer. Although the thin film encapsulation layer including the three inorganic layers and the two organic layers is exemplified herein, the OLED display device according to the present exemplary embodiment may have a thin film encapsulation layer in which an even greater number of inorganic layers and organic layers are alternately stacked.

According to the present exemplary embodiment, a first organic material for forming the first organic layer and a second organic material for forming the second organic layer may be the same as each other, or may differ from one another. Although the first organic material for forming the first organic layer is exemplified herein for ease of description, another organic layer constituting the thin film encapsulation layer may also be formed of materials described herein below.

The first organic material for forming the first organic layer may be one or more of the following materials: an acrylic resin, a methacrylic resin, polyisoprene, a vinyl resin, an epoxy resin, a urethane resin, a cellulose resin, a perylene resin, and/or other polymer materials.

In detail, examples of the acrylic resin may include butylacrylate, ethylhexylacrylate, and the like; examples of the methacrylic resin may include propyleneglycolmethacrylate, tetrahydrofurfuryl methacrylate, and the like; examples of the vinyl resin may include vinylacetate, N-vinylpyrrolidone (NVP), and the like; examples of the epoxy resin may include cycloaliphatic epoxide, epoxy acrylate, a vinyl epoxy resin, and the like; examples of the urethane resin may include urethane acrylate, and the like; examples of the cellulose resin may include cellulosenitrate, and the like. However, the examples thereof are not limited thereto.

Similarly, a first inorganic material for forming the first inorganic layer, a second inorganic material for forming the second inorganic layer, and a third inorganic material for forming the third inorganic layer may be the same as, or may differ from, one another. Although the first inorganic material for forming the first inorganic layer is exemplified herein for ease of description, another inorganic layer constituting the thin film encapsulation layer may also be formed of materials described herein below.

The first inorganic material for forming the first inorganic layer may be one or more of the following materials: silicon nitride, aluminum nitride, zirconium nitride, titanium nitride, hafnium nitride, tantalum nitride, silicon oxide, aluminum oxide, titanium oxide, tin oxide, cerium oxide, and/or silicon oxynitride ($SiO_xN_y$).

Hereinafter, a pixel of the OLED element 200 will be described with reference to FIGS. 5 and 6.

Figure 5:
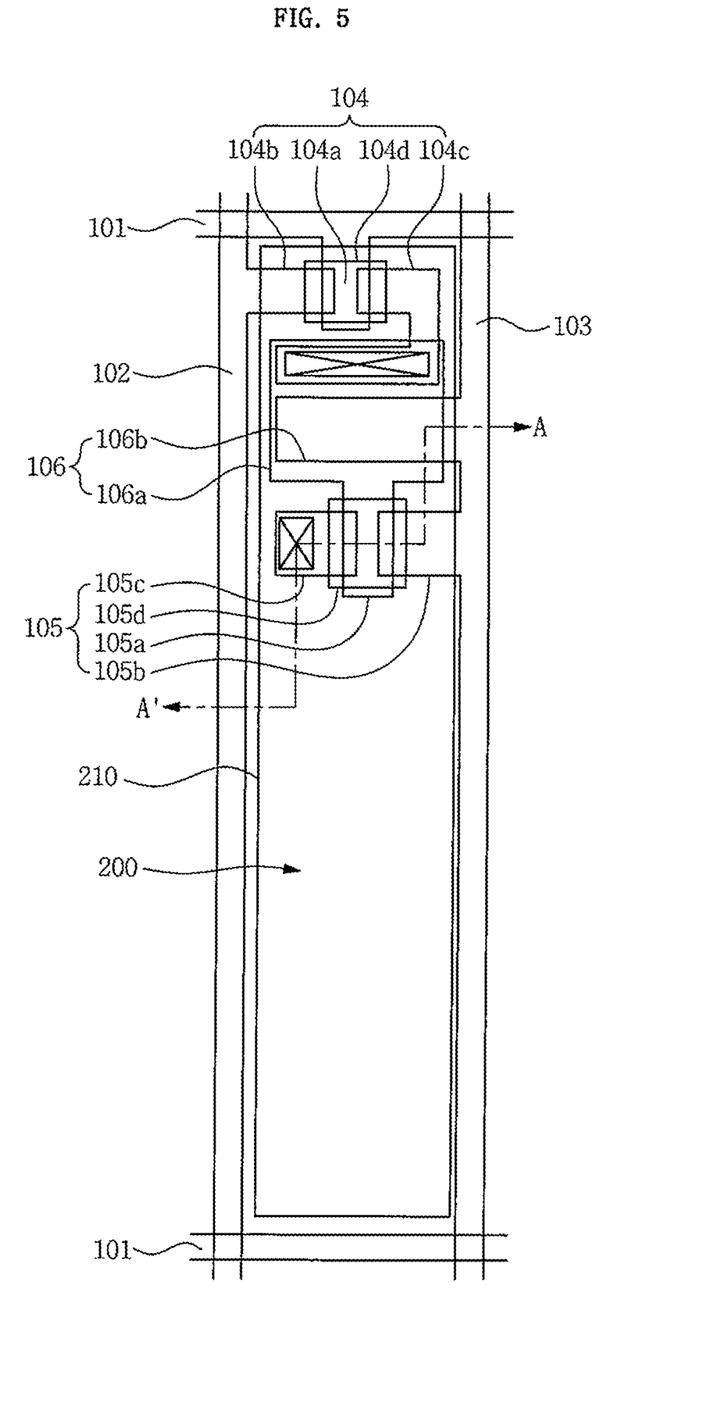
FIG. 5 is a plan view illustrating a pixel in area A of FIG. 1.

FIG. 5 is a plan view illustrating a pixel in area A of FIG. 1.

Referring to FIG. 5, in the OLED display device according to the exemplary embodiment, a plurality of pixel areas may be defined by a boundary among a gate line(s) 101, a data line 102 insulated from and crossing the gate line 101, and a common power line 103, and a single pixel may be located in a single pixel area therebetween. However, the definition of the pixel area is not limited thereto, and the pixel area may be defined by a pixel defining layer to be described further below. Alternatively, a plurality of pixels may be located in a single pixel area.

A single pixel of the OLED display device according to the exemplary embodiment may have a 2TFT-1CAP structure including two thin film transistors (e.g., a switching thin film transistor (TFT) 104 and a driving TFT 105), and a single capacitor (e.g., a capacitor (CAP) 106). However, the structure of the pixel is not limited thereto, and a single pixel may include three or more thin film transistors and two or more capacitors.

The switching TFT 104 may select a pixel to perform light emission. The switching TFT 104 may include a switching gate electrode 104a connected to the gate line 101, a switching source electrode 104b connected to the data line 102, a switching drain electrode 104c connected to a first capacitor plate 106a, and a switching semiconductor layer 104d.

Figure 6:
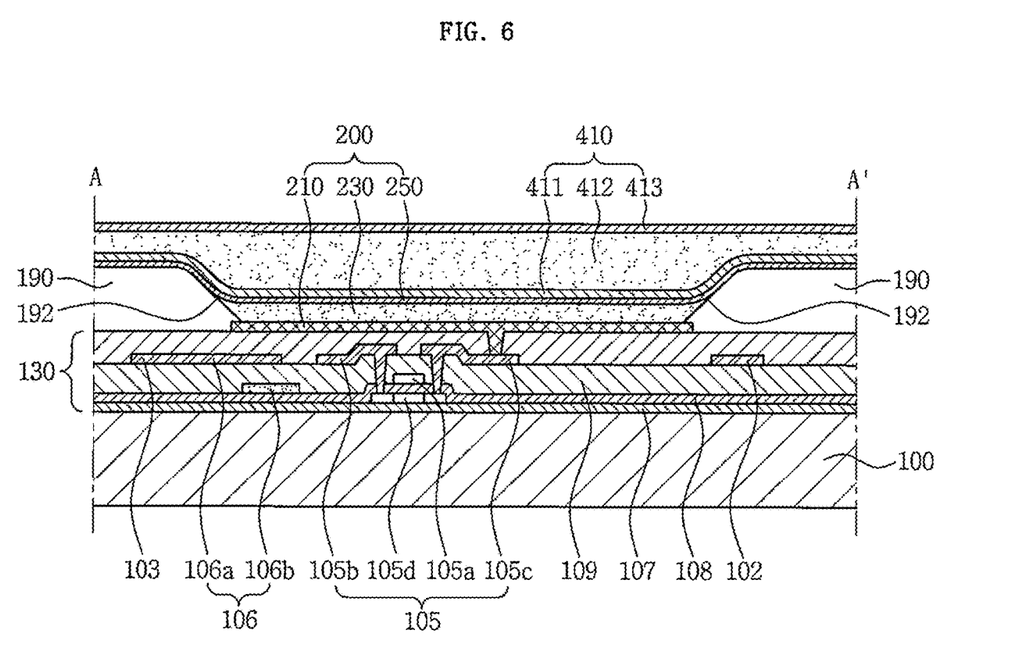
FIG. 6 is a cross-sectional view taken along the line A-A' of FIG. 5.

The driving TFT 105 may apply driving power for allowing a light emitting layer 230 (as shown in FIG. 6) in the pixel selected by the switching TFT 104 to perform light emission. The driving TFT 105 may include a driving gate electrode 105a connected to the first capacitor plate 106a, a driving source electrode 105b connected to the common power line 103, a driving drain electrode 105c connected to a first electrode 210 of the OLED element 200, and a driving semiconductor layer 105d.

The CAP 106 may include the first capacitor plate 106a and a second capacitor plate 106b. The first capacitor plate 106a may be connected to the switching drain electrode 104c and the driving gate electrode 105a, and the second capacitor plate 106b may be connected to the common power line 103. Capacitance of the CAP 106 may be determined by electric charge stored in the CAP 106 and by voltage between the first capacitor plate 106a and the second capacitor plate 106b.

A voltage having a level that is equivalent to a difference between a level of a data voltage transmitted by (or from) the switching TFT 104 and a level of a common voltage applied from the common power line 103 to the driving TFT 105 may be stored in the CAP 106, and a current having a level corresponding to the level of the voltage stored in the CAP 106 may flow to the light emitting layer 230 through the driving TFT 105 to allow the light emitting layer 230 to perform light emission.

FIG. 6 is a cross-sectional view taken along the line A-A' of FIG. 5.

Referring to FIG. 6, the OLED display device according to the exemplary embodiment may include the substrate 100, a driving circuit 130, the OLED element 200, and the thin film encapsulation layer 300.

As previously described with reference to FIG. 2, the substrate 100 may use an insulating substrate formed of one of the following materials: glass, quartz, ceramic, and plastic. However, the type of material forming the substrate 100 is not limited thereto, and the substrate 100 may also use a metallic substrate formed of stainless steel, or the like.

A buffer layer 107 may be located on the substrate 100, the buffer layer 107 including an inorganic layer or an organic layer. The buffer layer 107 may reduce or effectively prevent the infiltration of undesired components, such as impure elements or moisture through the substrate 100 and may also planarize a surface of the substrate 100. In addition, a gate insulating layer 108 may be located on the substrate 100 between the switching gate electrode 104a and the switching semiconductor layer 104d, and also between the driving gate electrode 105a and the driving semiconductor layer 105d. An insulating interlayer 109 may be located on the substrate 100 between the first capacitor plate 106a and the second capacitor plate 106b.

The driving circuit 130 may be located on the buffer layer 107. The driving circuit 130, including the switching TFT 104, the driving TFT 105, and the CAP 106, may drive the OLED element 200. As previously described with reference to FIG. 3, the OLED element 200 may display an image by emitting light based on a driving signal transmitted from the driving circuit 130.

The OLED element 200 may include the first electrode 210, the light emitting layer 230 located on the first electrode 210, and a second electrode 250 located on the light emitting layer 230. The first electrode 210 may be an anode that injects holes, and the second electrode 250 may be a cathode that injects electrons. However, the types of the first and second electrodes 210 and 250 are not limited thereto, and may be modified such that the first electrode 210 is a cathode and the second electrode 250 is an anode.

As another example, at least one of a hole injection layer and a hole transporting layer may further be interposed between the first electrode 210 and the light emitting layer 230, and at least one of an electron transporting layer and an electron injection layer may further be interposed between the light emitting layer 230 and the second electrode 250.

The OLED display device according to the exemplary embodiment may be a top-emission-type display device. Accordingly, the first electrode 210 may include a reflective layer, and the second electrode 250 may include a transflective layer. However, the type of the OLED display device is not limited thereto, and the OLED display device may instead be a bottom-emission-type display device. In this case, the first electrode 210 may include a transflective layer, and the second electrode 250 may include a reflective layer.

The reflective layer and the transflective layer may include one or more of the following metals: magnesium (Mg), silver (Ag), gold (Au), calcium (Ca), lithium (Li), chromium (Cr), aluminum (Al), and/or an alloy thereof. The type of the layer, that is, whether the reflective layer or the transflective layer, may be determined based on a thickness of the layer. In general, the transflective layer has a thickness of less than or equal to about 200 nanometers (nm).

The first electrode 210 may further include a transparent conductive layer, and the transparent conductive layer may include one or more transparent conductive oxides (TCO), such as indium tin oxide (ITO), indium zinc oxide (IZO), zinc oxide (ZnO), and/or indium oxide ($In_2O_3$).

The first electrode 210 may have a structure including a reflective layer, a double-layer structure including a reflective layer and a transparent conductive layer, or a triple-layer structure in which a transparent conductive layer, a reflective layer, and a transparent conductive layer are sequentially stacked. However, the structure of the first electrode 210 is not limited thereto, and the first electrode 120 may have a structure including a transparent conductive layer.

A pixel defining layer (PDL) 190 may be interposed between the first electrodes 210 of different/adjacent pixels. The PDL 190 may be formed of an insulating material, and may divide the first electrode 210 according to a pixel unit. In detail, the PDL 190 may be located on an edge portion of the first electrode 210 to divide the first electrode 210 in a pixel unit, to thereby define a pixel area.

The light emitting layer 230 may be located between the first electrode 210 and the second electrode 250. In other words, the light emitting layer 230 may be located in an aperture on the first electrode 210 that is defined by the PDL 190. The light emitting layer 230 may include a red light emitting layer, a green light emitting layer, and/or a blue light emitting layer.

The light emitting layer 230 may be formed in various ways, such as, for example, through a deposition process or through a transfer process using a donor film for transfer.

At least one of a hole injection layer, a hole transporting layer, an electron transporting layer, and an electron injection layer may further be provided between the first electrode 210 and the second electrode 250, in addition to the light emitting layer 230 therebetween. The light emitting layer 230, the hole injection layer, the hole transporting layer, the electron transporting layer, and the electron injection layer may be collectively referred to as an organic layer. Such an organic layer may be formed of a low molecular weight organic material or a polymer organic material.

The low molecular weight organic material may be applied to all of the hole injection layer, the hole transporting layer, the light emitting layer 230, the electron transporting layer, and/or the electron injection layer. The low molecular weight organic material may be stacked to have a single structure or a composite structure. The low molecular weight organic material may include copper phthalocyanine (CuPc), N,N'-di(naphthalene-1-yl)-N,N'-diphenyl-benzidine (NPB), tris-8-hydroxyquinoline aluminum) (Alq3), and/or the like. By performing a vacuum deposition process using a mask, the light emitting layer 230, the hole injection layer, the hole transporting layer, the electron transporting layer, the electron injection layer, and the like, may be formed using the low molecular weight organic material.

The polymer organic material may be applied to the hole transporting layer and the light emitting layer 230. In this instance, the hole transporting layer may use poly 3,4- ethylenedioxythiophene (PEDOT), and the light emitting layer 230 may use a poly-phenylenevinylene (PPV)-based polymer organic material and a polyfluorene-based polymer organic material.

The second electrode 250 may be located on the light emitting layer 230 and the PDL 190. The second electrode 250 may be formed of a material commonly used in the pertinent art. The second electrode 250 may use a transparent electrode or a reflective electrode. In an embodiment that uses a transparent electrode, the second electrode 250 may include a layer formed of Li, Ca, LiF/Ca, LiF/Al, Al, or Mg, or a compound thereof, and another layer formed thereon using a material for forming a transparent electrode such as, for example, ITO, IZO, ZnO, or $In_2O_3$. In a case of using a reflective electrode, the second electrode 250 may include a layer formed of Li, Ca, LiF/Ca, LiF/Al, Al, or Mg or a compound thereof. As the example illustrated in FIG. 4 depicts a top-emission-type OLED display device, the second electrode 250 may be manufactured as a transparent electrode. For example, the second electrode 250 may be formed of LiF/Al.

A capping layer may be formed on the second electrode 250. The capping layer may be formed of a transparent material having an ultraviolet (UV) light barrier characteristic, and may protect the OLED element 200 that includes the first electrode 210, the light emitting layer 230, and the second electrode 250.

As previously described with reference to FIG. 2, the thin film encapsulation layer 300, which has the multilayer structure in which the first inorganic layer 310, the first organic layer 320, and the second inorganic layer 330 are stacked, may be formed on the OLED element 200. In this instance, the first inorganic layer 310 and the second inorganic layer 330 may reduce or effectively prevent the infiltration of moisture or oxygen thereinto, and the first organic layer 320 may planarize a surface above the OLED element 200.

A method of manufacturing the OLED display device according to the exemplary embodiment may include: providing a substrate 100 including a display area DA and a non-display area NDA; forming an OLED element 200 in the display area DA; forming a barrier wall 400 around the display area DA to be spaced apart from the OLED element 200; performing a plasma treatment on the substrate 100 on which the OLED element 200 is formed; and forming a thin film encapsulation layer 300 coating the OLED element 200. The forming of the thin film encapsulation layer 300 may include: forming an inorganic layer (e.g., inorganic layer 310); and forming an organic layer (e.g., organic layer 320). In the forming of the organic layer, the organic layer may be formed inwardly of the barrier wall (e.g., such that the organic layer is surrounded by the barrier wall 400).

Hereinafter, the method of manufacturing the OLED display device according to the exemplary embodiment will be described in detail with reference to FIGS. 7A through 7E.

Figure 7A:
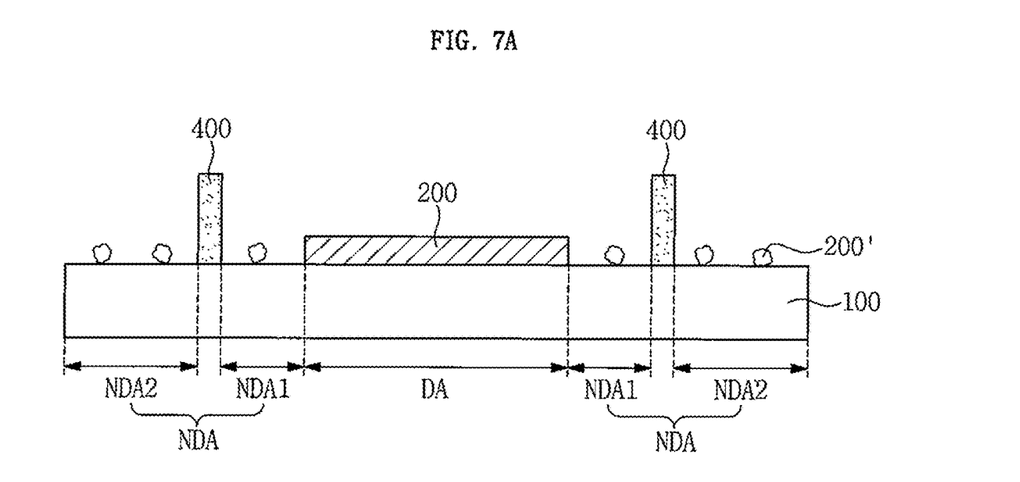
FIGS. 7A through 7E are cross-sectional views illustrating sequential processes of a method of manufacturing an OLED display device according to an exemplary embodiment, respectively.

The OLED element 200 may be formed in the display area DA of the substrate 100.

The forming of the OLED element 200 may include: forming an insulating layer on the substrate 100; forming a pattern of a first electrode on the insulating layer; forming a pixel defining layer by which the patterned first electrode is divided into a pixel unit; forming a light emitting layer on the first electrode in the pixel unit; and forming a second electrode on the light emitting layer.

The first electrode, the light emitting layer, and the second electrode of the OLED element 200 may be formed through a deposition process, a sputtering process, and/or a coating process, which are known or suitable to those skilled in the art. In this instance, at least one of a hole injection layer, a hole transporting layer, an electron transporting layer, and an electron injection layer may further be formed between the first electrode and the second electrode, in addition to the light emitting layer therebetween.

According to the present exemplary embodiment, the forming of the barrier wall 400 may be performed simultaneously with the forming of the pixel defining layer.

In this instance, the barrier wall 400 may be formed without manufacturing an additional mask, as a patterning for the barrier wall 400 may be added onto the non-display area NDA at the time of manufacturing the mask for forming the pixel defining layer.

The material for forming the barrier wall 400 may use the same material or substantially the same material as that of the material for forming the pixel defining layer. In detail, the material for forming the barrier wall 400 may include one of the following materials: an organic material such as a photoresist, a polyacrylic resin, a polyimide resin, and/or an acrylic resin, and an inorganic material such as a silicon compound.

The barrier wall 400 may be formed without being particularly limited by the position, the shape, the size, and the number thereof. The position of the barrier wall 400 may be present in any position within the non-display area NDA. However, more particularly, the barrier wall 400 may be positioned in the vinicity of the display area DA to improve the non-display area NDA. In addition, the barrier wall 400 may be formed to have various desired shapes such as a quadrangular shape, a circular shape, or a triangular shape.

With regard to the size of the barrier wall 400, since a height of the barrier wall 400 is affected by a thickness of the thin film encapsulation layer 300, the height of the barrier wall 400 may be, more particularly, less than the thickness of the thin film encapsulation layer 300, and because a width of the barrier wall 400 is affected by a width of the non-display area NDA, the width of the barrier wall 400 may be, in some embodiments, less than the width of the non-display area NDA.

As an example, the height of the barrier wall 400 may be formed to be the same as, lower than, or higher than a height of an uppermost organic layer constituting the thin film encapsulation layer 300. As another example, the height of the barrier wall 400 may be, more particularly, the same as, substantially the same as, or lower than, a height of an uppermost inorganic layer constituting the thin film encapsulation layer 300.

Referring to FIG. 7A, in the forming of the OLED element 200, a residual organic layer 200', which is a portion of an organic layer remaining on the substrate 100 (the organic layer including, for example the light emitting layer, a hole injection layer, a hole transporting layer, an electron transporting layer, and an electron injection layer) may be deposited in the non-display area NDA.

Since the non-display area NDA of the substrate 100, for example, the second non-display area NDA2 located outwardly of the barrier wall 400, is an area in which only an inorganic layer of a thin film encapsulation layer is required, when an organic layer (e.g., the residual organic layer 200') is present in such an area, the adhesiveness between the substrate 100 and the thin film encapsulation layer may decrease to thereby cause a peeling-off issue, thereby potentially allowing the external infiltration of moisture and oxygen, thus resulting in a dark spot defect.

Figure 7B:
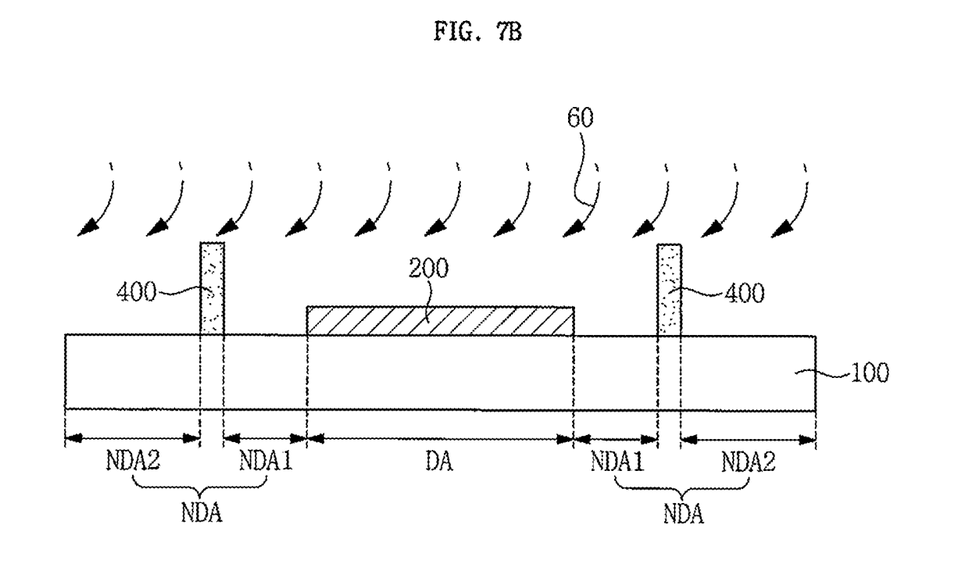

As illustrated in FIG. 7B, a plasma treatment may be performed to clean the substrate 100 on which the OLED element 200 is formed, such as by using a cleaning gas 60, such that the residual organic layer 200' generated during the forming of the OLED element 200 may be removed.

More particularly, the plasma cleaning treatment may be performed under an inert gas atmosphere. Examples of the inert gas may include argon (Ar), nitrogen ($N_2$), and the like. At the time of performing the plasma treatment, a degree of vacuum (e.g., the pressure in the inert gas atmosphere) may be in a range of about 0.5 Torr to about 2.5 Torr, more particularly, about 1.5 Torr; a flow rate of the inert gas may be in a range of about 5,000 standard cubic centimeters (sccm) to about 10,000 sccm; a level of radio-frequency (RF) power may be in a range of about 1,000 watts (W) to about 5,000 W; and a period of time for the plasma treatment may be within one minute, for example, in a range of about one second (s) to about 10 s.

In the aforementioned condition of the plasma treatment, an excellent cleaning effect thereof may be achieved. However, the condition of the plasma cleaning treatment is not limited thereto, and may be adjusted in various manners within the extent in which the residual organic layer 200' is effectively removed.

Through the plasma cleaning treatment, the residual organic layer 200' present in the non-display area NDA of the substrate 100, more particularly, the residual organic layer 200' present in the second non-display area NDA2, may be removed.

Figure 7C:
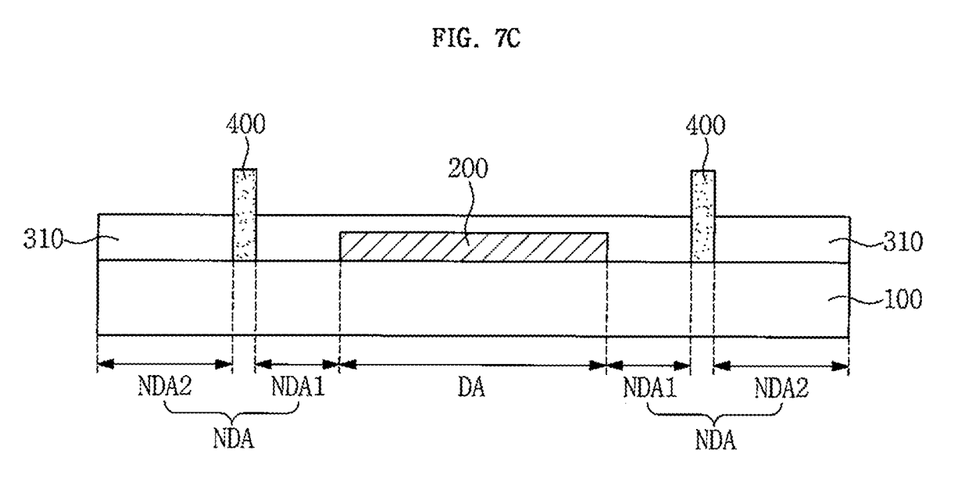
Figure 7D:
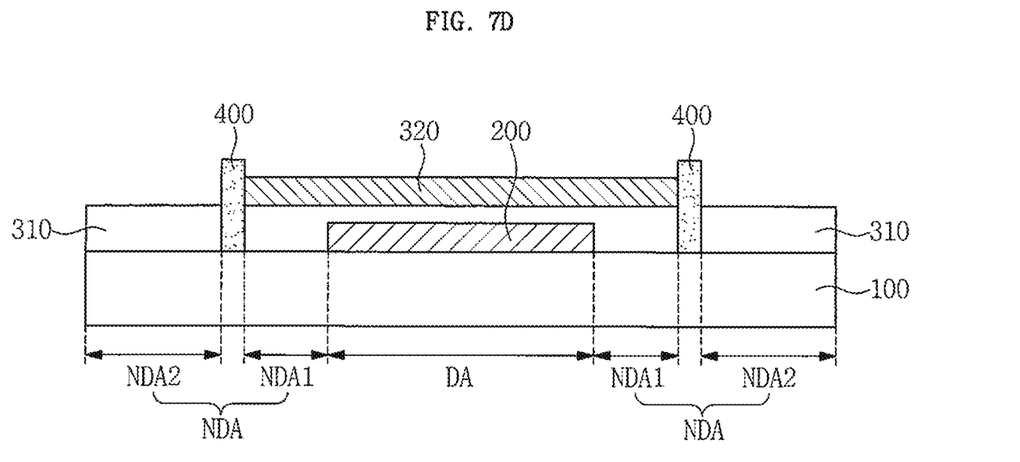
Figure 7E:
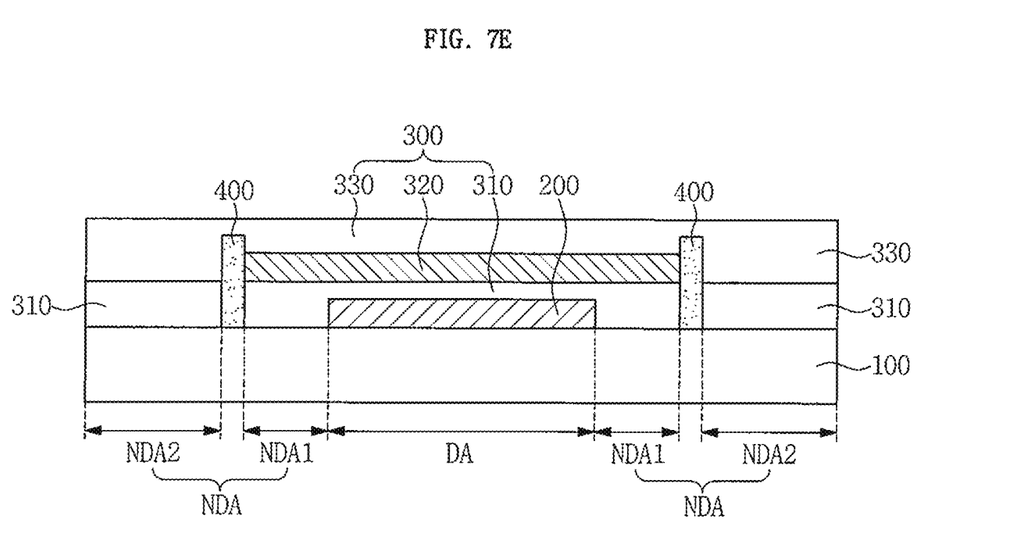

As illustrated in FIGS. 7C through 7E, the thin film encapsulation layer 300 coating the OLED element 200 may be formed.

The forming of the thin film encapsulation layer 300 may include forming an inorganic layer and forming an organic layer. The forming of the inorganic layer and the forming of the organic layer may be alternately performed a total of 2 to 20 times so as to form the thin film encapsulation layer 300 having the multilayer structure.

Referring to FIG. 7C, the first inorganic layer 310 coating the OLED element 200 may be formed on the substrate 100 on which the OLED element 200 is formed. The first inorganic layer 310 may be formed by performing a deposition process over the substrate 100, with the exception of over a portion(s) of the substrate 100 on which the barrier wall 400 is formed.

A material for forming the first inorganic layer 310 may be one or more of the following materials: silicon nitride, aluminum nitride, zirconium nitride, titanium nitride, hafnium nitride, tantalum nitride, silicon oxide, aluminum oxide, titanium oxide, tin oxide, cerium oxide, and/or silicon oxynitride ($SiO_xN_y$).

As illustrated in FIGS. 7D and 7E, the first organic layer 320 and the second inorganic layer 330 may be sequentially formed on the first inorganic layer 310.

A material for forming the first organic layer 320 may be one or more of the following materials: an acrylic resin, a methacrylic resin, polyisoprene, a vinyl resin, an epoxy resin, a urethane resin, a cellulose resin, a perylene resin, and/or other polymer materials.

In detail, examples of the acrylic resin may include butylacrylate, ethylhexylacrylate, and the like; examples of the methacrylic resin may include propyleneglycolmethacrylate, tetrahydrofurfuryl methacrylate, and the like; examples of the vinyl resin may include vinylacetate, N-vinylpyrrolidone (NVP), and the like; examples of the epoxy resin may include cycloaliphatic epoxide, epoxy acrylate, a vinyl epoxy resin, and the like; examples of the urethane resin may include urethane acrylate, and the like; and examples of the cellulose resin may include cellulosenitrate, and the like. However, the examples thereof are not limited thereto.

The first organic layer 320 may be formed by depositing monomers, and may be formed inwardly of (e.g., surrounded by) the barrier wall 400. Through the organic layer 320 being deposited only on a position requiring the deposition due to the barrier wall 400, issues of decreased adhesiveness, a dark spot defect, and the like, which may be otherwise caused by the monomers flowing into an area in which an inorganic layer is formed, may be addressed.

In addition, prior to forming the second inorganic layer 330 on the first organic layer 320, the plasma cleaning treatment described with reference to FIG. 7B may be performed. Through the plasma cleaning treatment, monomers deposited in an area that does not require deposition at the time of the forming of the first organic layer 320 may be effectively removed.

For any description omitted herein pertaining to a material for forming the second inorganic layer 330 and a process of forming thereof, reference may be made to analogous features of the first inorganic layer 310 described with reference to FIG. 7C.

Although FIGS. 7D and 7E illustrate an example in which the first organic layer 320 and the second inorganic layer 330 are additionally formed on the first inorganic layer 310, the forming of the inorganic layer and the forming of the organic layer may be alternately performed a total of 2 to 20 times to thereby form a thin film encapsulation layer in which a plurality of organic and inorganic layers are stacked.

As described hereinbefore, in the case of forming the thin film encapsulation layer by alternately performing the forming of the inorganic layer and the forming of the organic layer in an iterative manner, a height of the barrier wall 400 may be adjusted based on the forming of the thin film encapsulation layer.

Hereinafter, examples of the plasma cleaning treatment in the method of manufacturing the OLED display device according to the exemplary embodiment will be described in further detail. However, the present exemplary embodiment is not limited to the following examples.

INVENTIVE EXAMPLE 1

An OLED element is formed on a substrate, and prior to forming a first inorganic layer of a thin film encapsulation layer, a plasma cleaning treatment is performed. The plasma cleaning treatment is performed on the substrate on which the OLED element is formed, and under a $N_2/N_2O$ atmosphere. At the time of performing the plasma cleaning treatment herein, a degree of vacuum (e.g., a degree of pressure) is about 1.5 Torr; a flow rate of $N_2$ gas is about 16,000 standard cubic meters (scm); a flow rate of $N_2O$ gas is about 5,000 scm; a level of RF power is 3,000 W; and a period of time for the plasma cleaning treatment is about 10 s.

The first inorganic layer of the thin film encapsulation layer is formed on the substrate which has undergone the plasma cleaning treatment, and a first organic layer and a second inorganic layer are sequentially deposited on the first inorganic layer, such that the OLED display device is obtained.

COMPARATIVE EXAMPLE 1

An OLED display device is obtained through the same scheme as that of Inventive Example 1, except that a thin film encapsulation layer is formed without performing a plasma cleaning treatment subsequently to forming an OLED element on a substrate.

Figure 8:
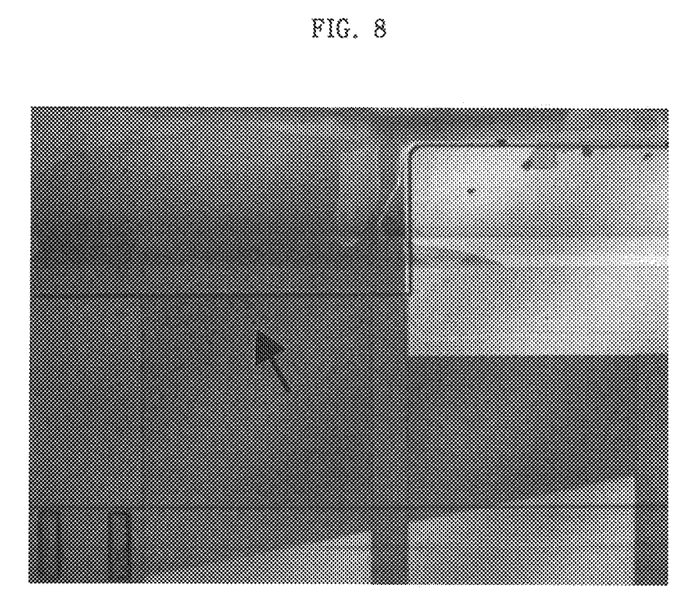
FIGS. 8 and 9 are images illustrating a surface analysis on an adhesive area between a substrate and a thin film encapsulation layer of OLED display devices according to a first Inventive Example and according to a first Comparative Example, respectively.
Figure 9:
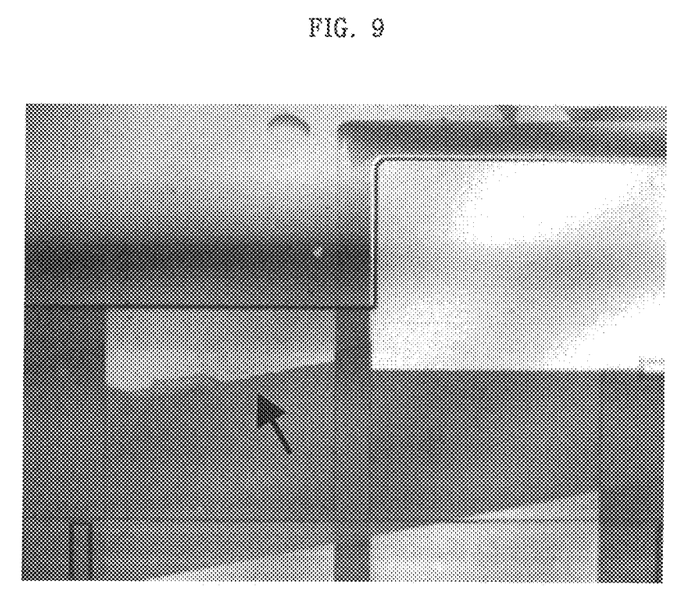

FIGS. 8 and 9 illustrate images evaluated by a surface analysis on an adhesive area between the substrate and the thin film encapsulation layer, for example, the first inorganic layer, in the OLED display devices according to Inventive Example 1 and Comparative Example 1, respectively.

Referring to FIGS. 8 and 9, it may be appreciated that a layer separation does not occur at the adhesive area between the substrate and the first inorganic layer of the thin film encapsulation layer of the OLED display device according to Inventive Example 1 (FIG. 8), while a layer separation does occur at the adhesive area between the substrate and the first inorganic layer of the thin film encapsulation layer of the OLED display device according to Comparative Example 1 (FIG. 9).

In this regard, it may be appreciated that in the OLED display device according to Comparative Example 1, as the interfacial adhesiveness between the substrate and the thin film encapsulation layer decreases over a course of time, an adhesion defect may occur therebetween. However, in the OLED display device according to Inventive Example 1, the interfacial adhesiveness between the substrate and the thin film encapsulation layer may increase, when compared to the Comparative Example 1, and thus, such an adhesion defect may not occur therebetween.

As set forth above, according to one or more exemplary embodiments, the OLED display device may enhance the adhesiveness between the substrate and the thin film encapsulation layer.

In addition, the OLED display device may reduce or effectively prevent the external infiltration of moisture and oxygen thereinto.

Further, the OLED display device may enhance the product reliability in providing a foldable, flexible, or rollable display device.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings.

What is claimed is:

1. An organic light emitting diode (OLED) display device comprising:
   a substrate comprising a display area and a non-display area;
   an organic light emitting diode element located at the display area;
   a thin film encapsulation layer coating the organic light emitting diode element; and
   a barrier wall around the display area and spaced apart from the organic light emitting diode element, the barrier wall having an inner side surface facing the display area and an outer side surface facing away from the display area, and a top surface extending from the inner side surface to the outer side surface,
   wherein the thin film encapsulation layer is a multilayer in which an inorganic layer and an organic layer are alternately stacked,
   wherein the organic layer is located inward of the barrier wall, and
   wherein the barrier wall is continuously placed and runs parallel along all four sides of the substrate and has one opening in the center of one of the four sides devoid of barrier wall material;
   wherein the barrier wall includes first, second, third, fourth and fifth walls, each having a line shape;
   wherein the first wall extends in a first direction;
   wherein the second wall extends from a first end portion of the first wall in a second direction crossing the first direction;
   wherein the third wall extends from a second end portion of the first wall in the second direction;
   wherein the fourth wall extends from an end portion of the second wall towards the third wall in the first direction;
   wherein the fifth wall extends from an end portion of the third wall towards the fourth wall;
   wherein an end portion of the fourth wall faces an end portion of the fifth wall;
   wherein the opening is disposed between the end portion of the fourth wall and the end portion of the fifth wall;
   wherein a distance between the end portion of the fourth wall and the end portion of the fifth wall is greater than lengths of the fourth and fifth walls;
   wherein the lengths and the distance are measured in the first direction;
   wherein the inorganic layer extends beyond the barrier wall and the opening in the barrier wall, and an area of the inorganic layer is smaller than an area of the substrate, and
   wherein the inorganic layer of the thin film encapsulation layer comprises a first inorganic layer and a second inorganic layer, and the organic layer of the thin film encapsulation layer comprises a first organic layer between the first and second inorganic layers,
   the first inorganic layer is on the substrate, surrounding the inner side surface and the outer side surface of the barrier wall and exposing the top surface of the barrier wall,
   the first organic layer is inwardly of the barrier wall, and the second inorganic layer is on the barrier wall.

2. The organic light emitting diode display device of claim 1, wherein the organic light emitting diode element comprises a first electrode, a light emitting layer, and a second electrode, which are sequentially stacked.

3. The organic light emitting diode display device of claim 1, wherein the outer side surface of the barrier wall directly contacts the first inorganic layer and the second inorganic layer.

4. The organic light emitting diode display device of claim 1, wherein the inorganic layer and the organic layer comprise 2 to 20 alternately stacked layers.

5. The organic light emitting diode display device of claim 1, wherein the barrier wall has a height that is the same as a height of an uppermost inorganic layer of the thin film encapsulation layer.

6. The organic light emitting diode display device of claim 1, wherein the barrier wall comprises two or more barrier walls.

7. The organic light emitting diode display device of claim 6, wherein a height difference is present between the two or more barrier walls.

8. The organic light emitting diode display device of claim 1, wherein the barrier wall comprises one of an organic material and an inorganic material.

9. The organic light emitting diode display device of claim 8, wherein the barrier wall comprises the organic material comprising at least one of a photoresist, a polyacrylic resin, a polyimide resin, and an acrylic resin.

10. The organic light emitting diode display device of claim 8, wherein the barrier wall comprises the inorganic material comprising a silicon compound.

11. The organic light emitting diode display device of claim 1, wherein the thin film encapsulation layer further coats the substrate, wherein the substrate has been plasma cleaned prior to coating of the thin film encapsulation layer.

12. An organic light emitting diode (OLED) display device comprising:
 a substrate comprising a display area and a non-display area;
 an organic light emitting diode element located at the display area;
 a thin film encapsulation layer coating the organic light emitting diode element; and
 a barrier wall around the display area and spaced apart from the organic light emitting diode element,
 wherein the thin film encapsulation layer is a multilayer in which at least one inorganic layer and at least one organic layer are alternately stacked,
 wherein the at least one organic layer is located inward of the barrier wall,
 wherein the barrier wall is continuously placed and runs parallel along all four sides of the substrate and has one opening in the center of one of the four sides devoid of barrier wall material,
 wherein the at least one organic layer includes an uppermost organic layer disposed farthest from the substrate,
 wherein the barrier wall has a height greater than a height of the uppermost organic layer, and
 wherein the at least one inorganic layer has a hole through which the barrier wall penetrates the at least one inorganic layer.

13. The organic light emitting diode display device of claim 12, wherein a first distance between an upper surface of the barrier wall and the substrate is greater than a second distance between an upper surface of the uppermost organic layer and the substrate.

* * * * *